United States Patent
Kang et al.

(10) Patent No.: US 7,968,442 B2
(45) Date of Patent: Jun. 28, 2011

(54) FIN FIELD EFFECT TRANSISTOR AND METHOD OF FABRICATING THE SAME

(75) Inventors: Jong-hoon Kang, Suwon-si (KR); Tai-su Park, Seoul (KR); Dong-chan Kim, Seoul (KR); Yu-gyun Shin, Seongnam-si (KR); Jeong-do Ryu, Seoul (KR); Seong-hoon Jeong, Masan-si (KR)

(73) Assignee: Samsung Electronics Co., Ltd. (KR)

( * ) Notice: Subject to any disclaimer, the term of this patent is extended or adjusted under 35 U.S.C. 154(b) by 23 days.

(21) Appl. No.: 12/459,660

(22) Filed: Jul. 6, 2009

(65) Prior Publication Data

US 2010/0109057 A1    May 6, 2010

(30) Foreign Application Priority Data

Oct. 31, 2008    (KR) .................. 10-2008-0107963

(51) Int. Cl.
*H01L 21/28* (2006.01)
(52) U.S. Cl. ............... 438/585; 257/E29.255
(58) Field of Classification Search .............. 257/288, 257/347, 369, E29.255; 438/585
See application file for complete search history.

(56) References Cited

U.S. PATENT DOCUMENTS

| | | | | |
|---|---|---|---|---|
| 7,297,600 B2 * | 11/2007 | Oh et al. | ...................... | 438/283 |
| 7,452,776 B1 * | 11/2008 | He et al. | ...................... | 438/259 |
| 7,514,346 B2 * | 4/2009 | Chau et al. | ...................... | 438/591 |
| 7,550,333 B2 * | 6/2009 | Shah et al. | ...................... | 438/157 |
| 7,560,756 B2 * | 7/2009 | Chau et al. | ...................... | 257/287 |
| 7,745,871 B2 * | 6/2010 | Oh et al. | ...................... | 257/314 |
| 2004/0150029 A1 * | 8/2004 | Lee | ...................... | 257/308 |
| 2005/0184283 A1 * | 8/2005 | Maeda et al. | ...................... | 257/4 |
| 2005/0224890 A1 * | 10/2005 | Bernstein et al. | ...................... | 257/371 |
| 2005/0272192 A1 * | 12/2005 | Oh et al. | ...................... | 438/197 |
| 2008/0061383 A1 | 3/2008 | Kawakita | | |
| 2009/0108358 A1 * | 4/2009 | Lee | ...................... | 257/368 |
| 2010/0052043 A1 * | 3/2010 | Lee | ...................... | 257/325 |
| 2010/0075473 A1 * | 3/2010 | Gibbons | ...................... | 438/157 |

FOREIGN PATENT DOCUMENTS

| | | |
|---|---|---|
| JP | 2008-66516 | 3/2008 |
| KR | 10-2006-0079329 A | 7/2006 |
| KR | 10-2007-0024965 A | 3/2007 |

* cited by examiner

*Primary Examiner* — Nathan W Ha

(74) *Attorney, Agent, or Firm* — Mills & Onello, LLP

(57) ABSTRACT

A fin field effect transistor includes a fin protruding from a semiconductor substrate, a gate insulating layer formed so as to cover upper and lateral surfaces of the fin, and a gate electrode formed across the fin so as to cover the gate insulating layer. An upper edge of the fin is rounded so that an electric field concentratedly applied to the upper edge of the fin through the gate electrode is dispersed. A thickness of a portion of the gate insulating layer formed on an upper surface of the fin is greater than a thickness of a portion of the gate insulating layer formed on a lateral surface of the fin, in order to reduce an electric field applied through the gate electrode.

7 Claims, 9 Drawing Sheets

FIN FIELD EFFECT TRANSISTOR AND METHOD OF FABRICATING THE SAME

CROSS-REFERENCE TO RELATED APPLICATIONS

This application claims the benefit under 35 U.S.C. 119 of Korean Patent Application No. 10-2008-0107963, filed on Oct. 31, 2008, in the Korean Intellectual Property Office, the entire contents of which are incorporated herein by reference.

BACKGROUND

The inventive concept relates to a semiconductor device and a method of fabricating the same, and more particularly, to a fin field effect transistor and a method of fabricating the same.

As the development and improvement of highly-integrated semiconductor devices has advanced, the lengths of gates of field effect transistors have been decreased. A drawback to the decrease in gate length is the short channel effect. In addition, charge mobility and driving current decrease due to increased current concentration in a channel, and junction leakage current increases due to reduced source/drain junction depth. Thus, in order to overcome the limits of a horizontal field effect transistor, research has been conducted on a fin field effect transistor having a three-dimensional structure.

However, in such a fin field effect transistor, an electric field concentrates around an upper edge of a fin during the operation of the fin field effect transistor, and thus a leakage current is generated. In addition, when the three-dimensional fin field effect transistor is used in a dynamic random access memory (DRAM) device or other such device, an electric field may concentrate around an upper edge of a fin during the operation of the fin field effect transistor, and thus static refresh characteristics may be degraded, or the reliability of the DRAM device may decrease.

SUMMARY

The inventive concept provides a fin field effect transistor in which an electric field can be prevented from concentrating around an upper edge of a fin during the operation of the fin field effect transistor.

The inventive concept also provides a method of fabricating a fin field effect transistor in which an electric field can be prevented from concentrating around an upper edge of a fin during the operation of the fin field effect transistor.

According to an aspect of the inventive concept, there is provided a fin field effect transistor including a fin protruding from a semiconductor substrate; a gate insulating layer formed so as to cover upper and lateral surfaces of the fin; and a gate electrode formed across the fin so as to cover the gate insulating layer. An upper edge of the fin may be rounded so that an electric field applied to the upper edge of the fin through the gate electrode is dispersed. A thickness of a portion of the gate insulating layer formed on an upper surface of the fin may be greater than a thickness of a portion of the gate insulating layer formed on a lateral surface of the fin, in order to reduce an electric field applied through the gate electrode.

A thickness of a portion of the gate insulating layer formed on the rounded upper edge of the fin may be greater than a thickness of a portion of the gate insulating layer formed on the lateral surface of the fin.

According to another aspect of the inventive concept, there is provided a method of fabricating a fin field effect transistor. In the method, a fin protruding from a semiconductor substrate may be formed. A gate insulating layer may be formed so as to cover upper and lateral surfaces of the fin while simultaneously rounding an upper edge of the fin, wherein a thickness of a portion of the gate insulating layer formed on the upper surface of the fin is greater than a thickness of a portion of the gate insulating layer formed on the lateral surface of the fin. A gate electrode may be formed across the fin so as to cover the gate insulating layer.

The forming of the gate insulating layer so as to cover the upper and lateral surfaces of the fin while rounding the upper edge of the fin may be performed using an oxidation method including a plasma process.

The oxidation method including the plasma process may include forming the gate insulating layer on the fin while applying a bias voltage to the semiconductor substrate positioned on the semiconductor substrate positioned in a plasma chamber and rounding the upper edge of the fin by scattering and bombarding ions or radicals included in plasma.

According to another aspect of the inventive concept, there is provided a method of fabricating a fin field effect transistor. In the method, a fin protruding from a semiconductor substrate may be formed, and an upper edge of the fin may be rounded. A gate insulating layer may be formed so as to cover the rounded upper edge of the fin and a lateral surface of the fin, wherein a thickness of a portion of the gate insulating layer formed on an upper surface of the fin is greater than a thickness of a portion of the gate insulating layer formed on the lateral surface of the fin. A gate electrode may be formed across the fin so as to cover the gate insulating layer.

The rounding of the upper edge of the fin may be performed by etching the upper edge of the fin using a dry etching process.

Forming of the gate insulating layer having a lateral portion and an upper portion thicker than the lateral portion may be performed by increasing directional characteristics of oxidation gas injected to a plasma chamber while applying a bias voltage to the semiconductor substrate positioned in the plasma chamber.

Forming of the gate insulating layer having a lateral portion and an upper portion thicker than the lateral portion may be performed by injecting oxygen ions having directional characteristics by applying an electric field to the semiconductor substrate positioned in the ion injection chamber and then oxidizing the fin, or by amorphizing the fin by injecting an ion to the semiconductor substrate positioned in the ion injection chamber, and then oxidizing the fin that is amorphized.

The forming of the gate insulating layer having a lateral portion and an upper portion thicker than the lateral portion may be performed by changing the plane index of the semiconductor substrate so that a reaction rate of the upper surface of the fin is faster than that reaction rate of the lateral surface of the fin.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

A three-dimensional fin field effect transistor according to the inventive concept includes a modified gate insulating layer in order to prevent or reduce an electric field concentration generated around an upper edge of a fin of the fin field effect transistor. In prior devices, an electric field concentration is generated around the upper edge of the fin from upper and lateral surfaces of the fin, thereby increasing a leakage current. To overcome this problem, the thickness of a gate insulating layer formed on the upper and lateral surfaces is increased. In prior devices, an on-current of the fin field effect transistor decreases as a result.

Accordingly, in the fin field effect transistor according to the inventive concept, by selectively increasing the thickness of a portion of the gate insulating layer formed on a specific surface of the fin, the decrease of the on-current is prevented. In particular, in the fin field effect transistor according to the inventive concept, the thickness of a portion of the gate insulating layer formed on an upper surface of the fin is greater than the thickness of a portion of the gate insulating layer formed on a lateral surface of the fin. Accordingly, the on-current is increased and the size of the fin field effect transistor can be reduced.

In the fin field effect transistor according to the inventive concept, an upper edge of the fin is rounded in addition to adjusting the thickness of the gate insulating layer. When the upper edge of the fin is rounded, electric field concentration can be prevented or reduced, and leakage current is further reduced.

As described above, in the fin field effect transistor according to the inventive concept, the thickness of the gate insulating layer formed on an upper surface of the fin is greater than the thickness of the gate insulating layer formed on the lateral surface of the gate insulating layer while the upper edge of the fin of the gate insulating layer is rounded. The rounding of the upper edge of the fin and the forming the gate insulating layer having the lateral portion and the upper portion thicker than the lateral portion may be simultaneously performed using a single operation, or alternatively may be performed using two processes. When the single operation is used, the fin field effect transistor according to the inventive concept can be efficiently fabricated.

A fin field effect transistor will now be described with reference to the accompanying drawings, in which exemplary embodiments of the inventive concept are shown. The inventive concept may, however, be embodied in many different forms and should not be construed as being limited to the embodiments set forth herein; rather, these embodiments are provided so that this description will be thorough and complete, and will fully convey the invention to those skilled in the art.

Figure 1:
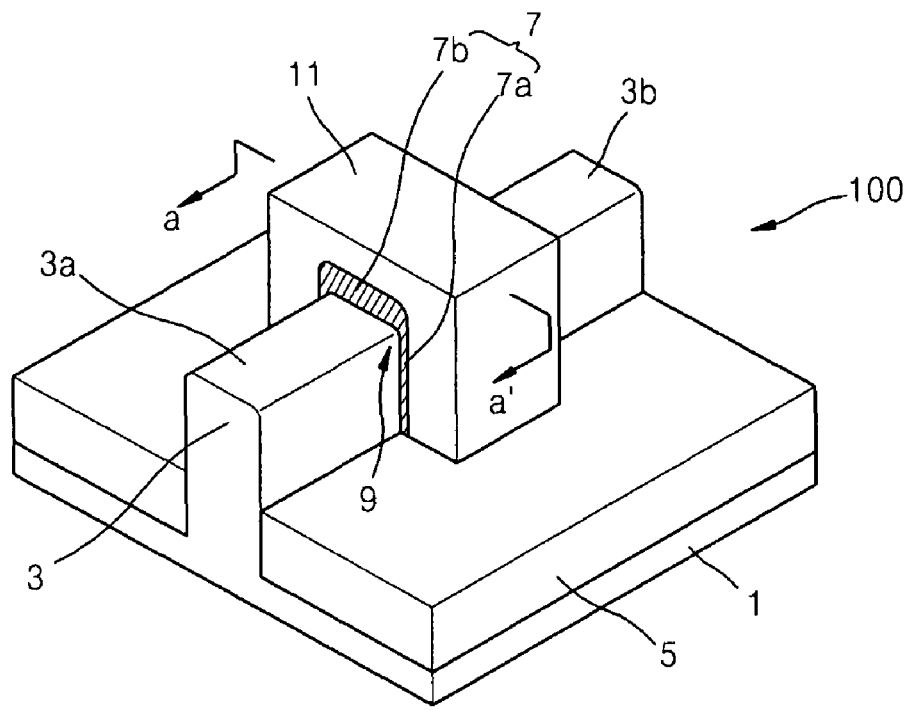
FIG. 1 is a perspective view of a fin field effect transistor according to an embodiment of the inventive concept.

FIG. 1 is a perspective view of a fin field effect transistor 100 according to an embodiment of the inventive concept.

In particular, the fin field effect transistor 100 includes a fin (body) 3 protruding from a semiconductor substrate 1. Insulating layers 5 are formed on both portions of an upper surface of the semiconductor substrate 1 so as to be disposed next to both lateral surfaces of the fin 3. Each of the insulating layers 5 functions as an isolation layer. The semiconductor substrate 1 may be a silicon substrate, and the fin 3 may be a silicon layer. In addition, the semiconductor substrate 1, the insulating layers 5, and the fin 3 may be formed by patterning a silicon-on-insulator (SOI) substrate.

A gate insulating layer 7 is formed so as to cover upper and lateral surfaces of the fin 3. The gate insulating layer 7 may be a silicon oxide layer. A gate electrode 11 is formed across the fin 3 so as to cover the gate insulating layer 7 covering the upper and lateral surfaces of the fin 3. The gate electrode 11 may be a polysilicon layer doped with impurities or may be formed by depositing metal silicide on a polysilicon layer doped with impurities. Source and drain regions 3a and 3b are formed using an ion injection process on both portions of an upper surface of the fin 3 in a direction parallel to the fin 3 so as to be disposed next to the gate electrode 11.

Upper edges 9 of the fin 3 are rounded. In this case, an electric field that is concentratedly applied to the upper edges 9 of the fin 3 through the gate electrode 11 can be dispersed. The dispersion of the electric field applied to the fin 3 and a method of rounding the upper edges 9 of the fin 3 will be described in detail.

The thickness of a gate insulating layer 7b formed on the upper surface of the fin 3 is greater than the thickness of a gate insulating layer 7a formed on the lateral surface of the fin 3. In this case, the electric field that is concentratedly applied to the upper edges 9 of the fin 3 through the gate electrode 11 can be dispersed. The dispersion of the electric field applied to the fin 3 and a method of forming the gate insulating layer 7 on the fin 3 will be described in detail.

FIGS. 2 through 6 are cross-sectional views of the fin field effect transistor 100 taken along a line a-a' of FIG. 1, illustrating a method of fabricating the fin field effect transistor 100.

Figure 2:
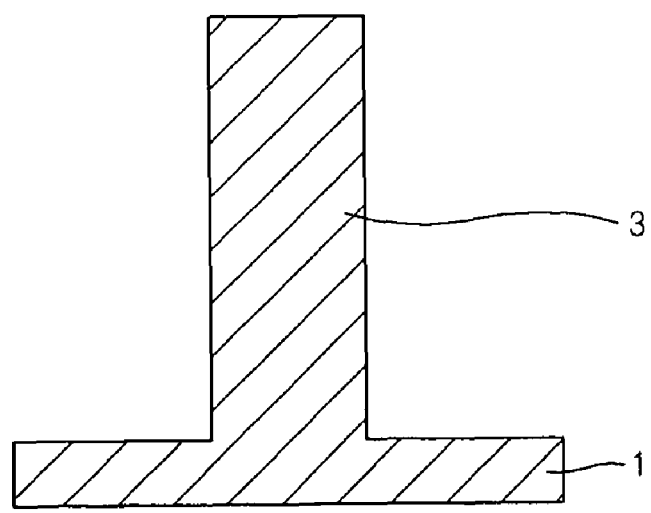
FIGS. 2 through 6 are cross-sectional views of the fin field effect transistor taken along a line a-a' of FIG. 1, illustrating a method of fabricating the fin field effect transistor.

Referring to FIG. 2, the fin (body) 3 is formed on the semiconductor substrate 1, for example, a silicon substrate. The fin 3 is formed by etching the semiconductor substrate 1. A portion of the semiconductor substrate 1 on which the fin 3 is formed is an active region, and a portion of the semiconductor substrate 1 on which the fin is not formed is a non-active region or an isolation region. The fin 3 may be formed by forming a mask layer, for example, an oxide layer pattern or a nitride layer pattern, on the semiconductor substrate 1 and then selectively etching the semiconductor substrate 1 by using the mask layer as a mask. The fin 3 may also be formed by other various methods.

Figure 3:
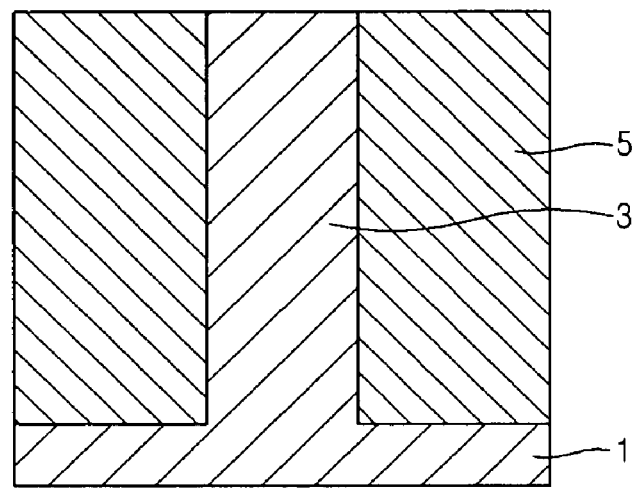
Figure 4:
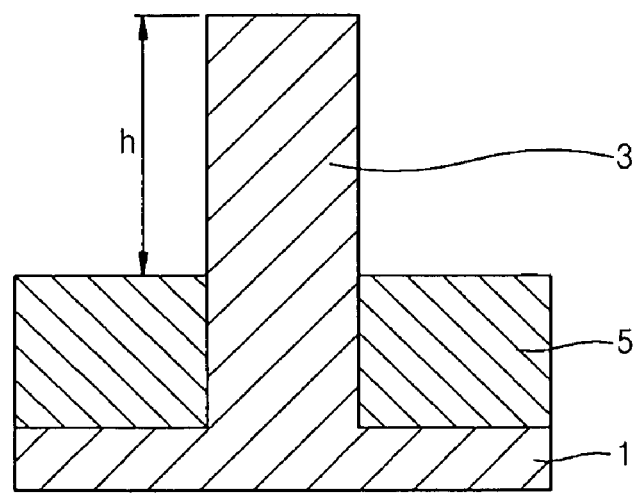

Referring to FIGS. 3 and 4, as illustrated in FIG. 3, the insulating layers 5, for example, oxide layers, are formed next to both lateral surfaces of the fin 3. The insulating layers 5 may be formed by forming an insulating material layer (not shown) on the entire surface of the semiconductor substrate 1 and then planarizing the insulating material layer by chemical mechanical polishing (CMP).

As illustrated in FIG. 4, a portion of the lateral surface of the fin 3 is exposed by partially etching the insulating layer 5 formed next to the lateral surface of the fin 3. The channel length and channel width of a device are determined according to the height 'h' of the exposed portion of the fin 3, and the height 'h' of the exposed portion of the fin 3 is determined according to the characteristics of the device.

Figure 5:
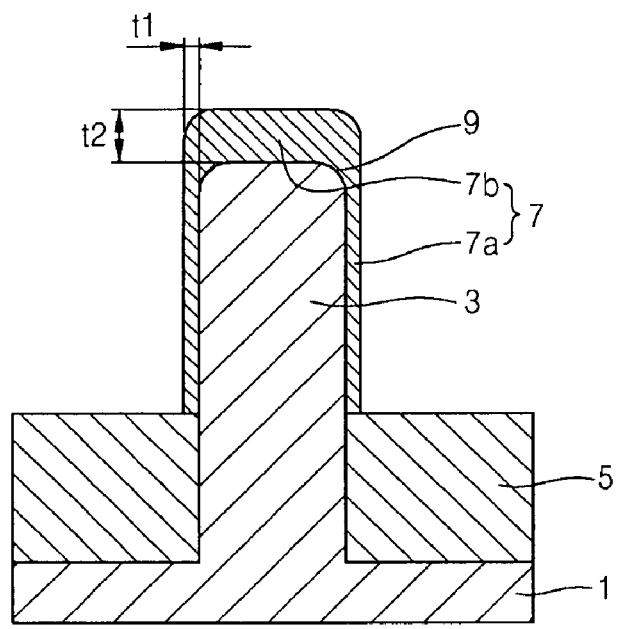

Referring to FIG. 5, the upper edges 9 of the fin 3 are rounded, and the gate insulating layer 7 having a lateral portion 7a and an upper portion 7b thicker than the lateral portion 7a is formed. That is, the upper edges 9 of the fin 3 are rounded, and the gate insulating layer 7a and the gate insulating layer 7b are formed so that the thickness 't2' of the gate insulating layer 7b formed on the upper surface of the fin 3 is greater than the thickness 't1' of the gate insulating layer 7b formed on the lateral surface of the fin 3. Rounding the upper edges 9 of the fin 3 and forming the gate insulating layer 7 having the lateral portion 7a and the upper portion 7b thicker than the lateral portion 7a may be simultaneously performed using a single operation.

The rounding of the upper edges 9 of the fin 3 and the forming of the gate insulating layer 7 having the lateral portion 7a and the upper portion 7b thicker than the lateral portion 7a may be performed using an oxidation method including a plasma process.

In the oxidation method including the plasma process, the semiconductor substrate 1 of FIG. 4 is positioned in a plasma chamber, and the gate insulating layer 7 is formed on the fin 3 while applying a bias voltage to the semiconductor substrate 1 positioned in the plasma chamber and rounding the upper edges 9 of the fin 3 by scattering and bombarding ions or radicals included in plasma generated from an oxide gas injected into the plasma chamber.

In the oxidation method including the plasma process, plasma may be excited by radio frequency (RF) or microwaves, an oxidation gas may be an oxygen gas or an oxygen gas containing hydrogen, and an inert gas may be Ar, Xe or Kr. As examples of detailed process conditions, a pressure of the plasma chamber may be in the range of about 1 mTorr to about 760 Torr, the bias voltage may be in the range of about 1 mV to about 100 kV, and a source power may be equal to or less than 10 kW. The bias voltage may be applied using a direct current (DC), a DC pulse, or an alternating current (AC).

The rounding of the upper edges 9 of the fin 3 and the forming of the gate insulating layer 7 having the lateral portion 7a and the upper portion 7b thicker than the lateral portion 7a may be performed using two processes. When two processes are used, the rounding of the upper edges 9 of the fin 3 may be performed by etching the upper edges 9 of the fin 3 by using a dry etching process using plasma.

When the two processes are used, in the forming of the gate insulating layer 7 having the lateral portion 7a and the upper portion 7b thicker than the lateral portion 7a, the semiconductor substrate 1 of FIG. 5 is positioned in a plasma chamber, and the gate insulating layer 7 is formed so that the upper portion 7b is thicker than lateral portion 7a by increasing directional characteristics of the oxidation gas injected into the plasma chamber while applying a bias voltage to the semiconductor substrate 1 positioned in the plasma chamber. In this case, the process conditions in the plasma chamber may be as described above.

Moreover, when the two processes are used, in the forming of the gate insulating layer 7 having the lateral portion 7a and the upper portion 7b thicker than the lateral portion 7a, the semiconductor substrate 1 is positioned in an ion injection chamber, and the gate insulating layer 7 is formed by injecting oxygen ions having directional characteristics by applying an electric field to the semiconductor substrate 1 positioned in the ion injection chamber.

In addition, when the two processes are used, in the forming of the gate insulating layer 7 having the lateral portion 7a and the upper portion 7b thicker than the lateral portion 7a, the semiconductor substrate 1 is positioned in an ion injection chamber, and the gate insulating layer 7 is formed using a method including amorphizing the fin 3, for example, a silicon layer, by injecting atoms such as F atoms into the semiconductor substrate 1 positioned in the ion injection chamber and then oxidizing the fin 3.

In addition, when the two processes are used, the forming of the gate insulating layer 7 having the lateral portion 7a and the upper portion 7b thicker than the lateral portion 7a may be performed by changing the plane index of the semiconductor substrate 1, that is, a semiconductor wafer, so that the reaction rate of the upper surface of the fin 3 is faster than that of the lateral surface of the fin 3.

Figure 6:
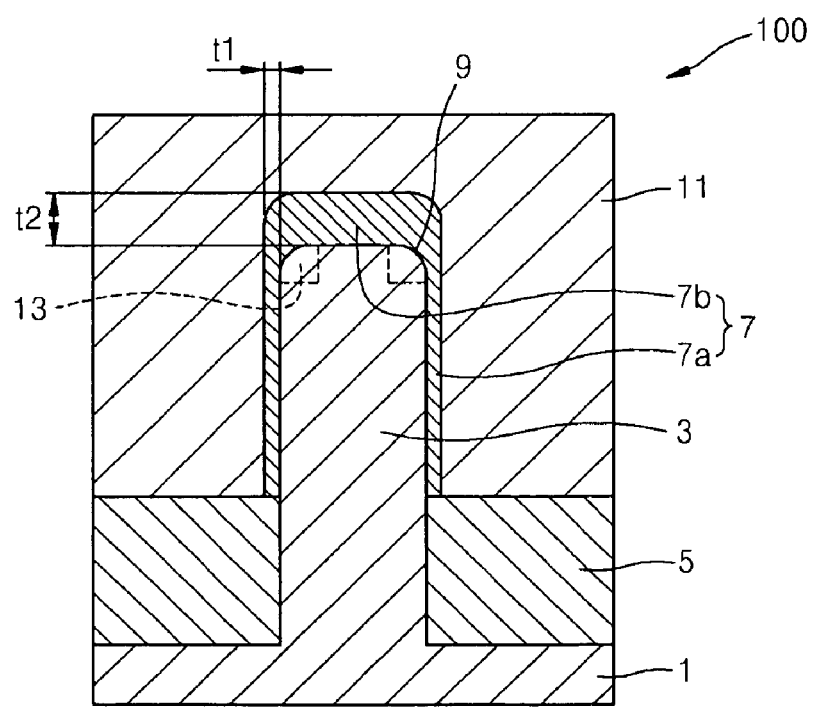

Referring to FIG. 6, the upper edges 9 are rounded, and the gate electrode 11 is formed on the gate insulating layer 7 having the lateral portion 7a and the upper portion 7b thicker than the lateral portion 7a. Then, as illustrated in FIG. 1, the source and drain regions 3a and 3b are formed using an ion injection process with respect to both portions of an upper surface of the fin 3 so as to be disposed next to the gate electrode 11, thereby completing the fabrication the fin field effect transistor 100. In the fin field effect transistor 100 of FIG. 6, an electric field does not concentrate around a corner channel 13 during the operation of the fin field effect transistor 100.

Figure 7:
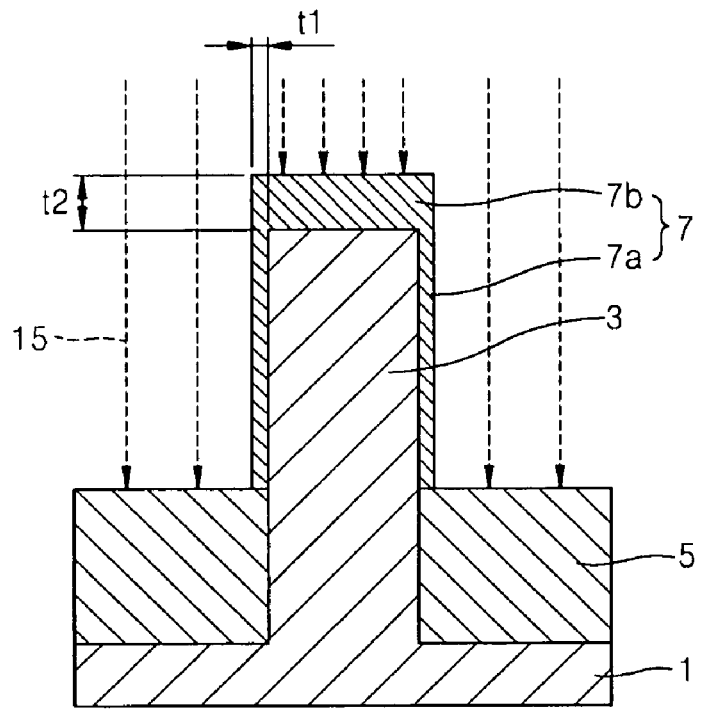
FIGS. 7 and 8 are cross-sectional view illustrating a method of forming a gate insulating layer of FIG. 5, according to an embodiment of the inventive concept.
Figure 8:
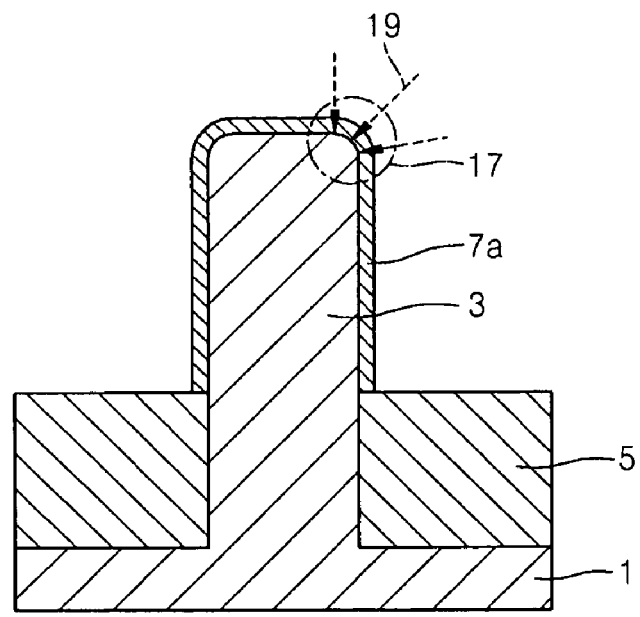

FIGS. 7 and 8 are cross-sectional views illustrating a method of forming the gate insulating layer 7 of FIG. 5, according to an embodiment of the inventive concept.

In particular, FIG. 7 illustrates the case where the thickness 't2' of the gate insulating layer 7b formed on the upper surface of the fin 3 is greater than the thickness 't1' of the gate insulating layer 7a formed on the lateral surface of the fin 3, according to an embodiment of the inventive concept. Referring to FIG. 7, when an oxidation process is performed in order to form the gate insulating layer 7, the gate insulating layer 7 is formed so that the thickness 't2' of the gate insulating layer 7b formed on the upper surface of the fin 3 is greater than the thickness 't1' of the gate insulating layer 7a of the lateral surface of the fin 3 by increasing directional characteristics in a direction of an oxidation gas 15 injected into a plasma chamber. When a bias voltage is applied to the semiconductor substrate 1 positioned in the plasma chamber, the ratio between the thickness 't2' of the gate insulating layer 7b and the thickness 't1' of the gate insulating layer 7a may be adjusted.

FIG. 8 illustrates an operation of rounding an upper edge portion 17 of the fin 3, according to an embodiment of the inventive concept. Referring to FIG. 8, the upper edge portion 17 is rounded by scattering and bombarding ions or radicals 19 included in plasma generated by the oxidation gas injected into the plasma chamber.

Figure 9:
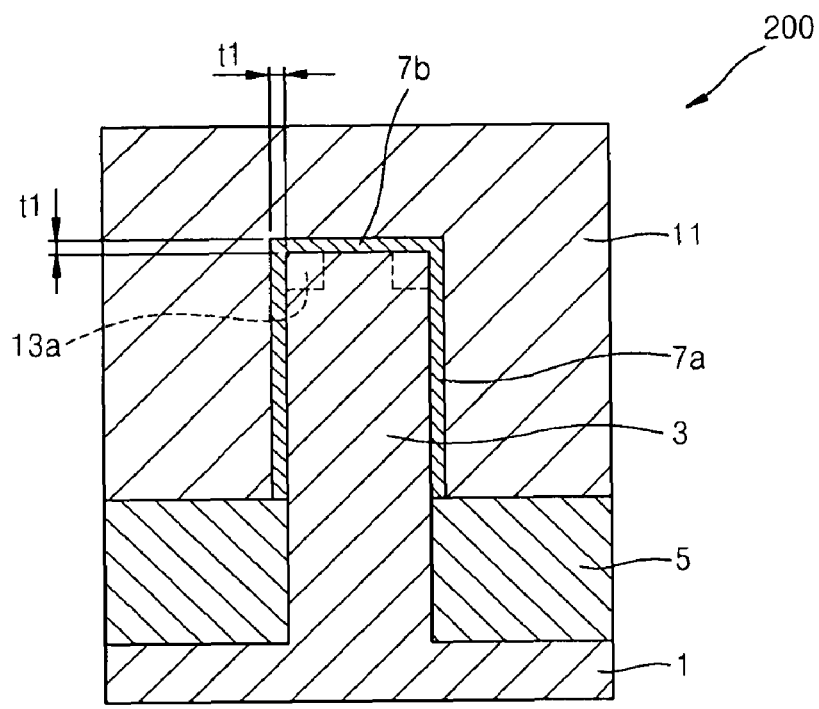
FIG. 9 is a cross-sectional view of a fin field effect transistor as a comparative example related to the fin field effect transistor of FIG. 6.
Figure 10:
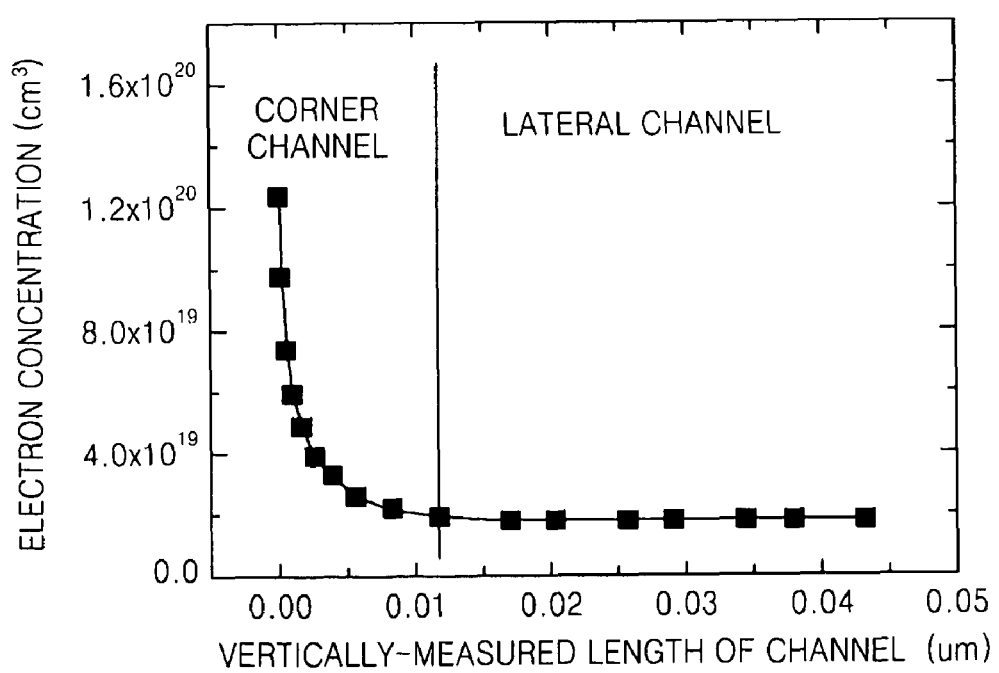
FIG. 10 is a graph of an electron concentration with respect to a vertical length of a channel FIG. 9.

FIG. 9 is a cross-sectional view of a fin field effect transistor 200 as a comparative example related to the fin field effect transistor of FIG. 6. FIG. 10 is a graph of an electron concentration which is vertically measured with respect to a length of a channel of FIG. 9.

In particular, when comparing the fin field effect transistor 100 of FIG. 6 of the inventive concept and the fin field effect transistor 200 of FIG. 9, upper edges of a fin 3 in FIG. 9 are not rounded, and the thickness 't1' of a gate insulating layer 7b formed on an upper surface of the fin 3 in FIG. 9 is equal to the thickness 't1' of a gate insulating layer 7a formed on a lateral surface of the fin 3.

In the fin field effect transistor 200, since an electric field concentrates around a corner channel 13a during the operation of the fin field effect transistor 200, the electron concentration of the corner channel 13 increases, and the electron concentration of a lateral channel (sidewall channel) decreases, as illustrated in FIG. 10. In FIG. 10, the X axis is a channel length that is vertically measured from the corner channel 13a of FIG. 9. In the fin field effect transistor 200 of FIG. 9, an electric field concentrates around an upper edges of the fin 3, that is, the corner channel 13a, and thus a leakage current may be generated due to gate induced drain leakage (GIDL), etc., even if the fin field effect transistor 200 is powered-off, and the static refresh characteristics and reliability of a device including the fin field effect transistor 200, such as a dynamic random access memory (DRAM), may be degraded.

Figure 11:
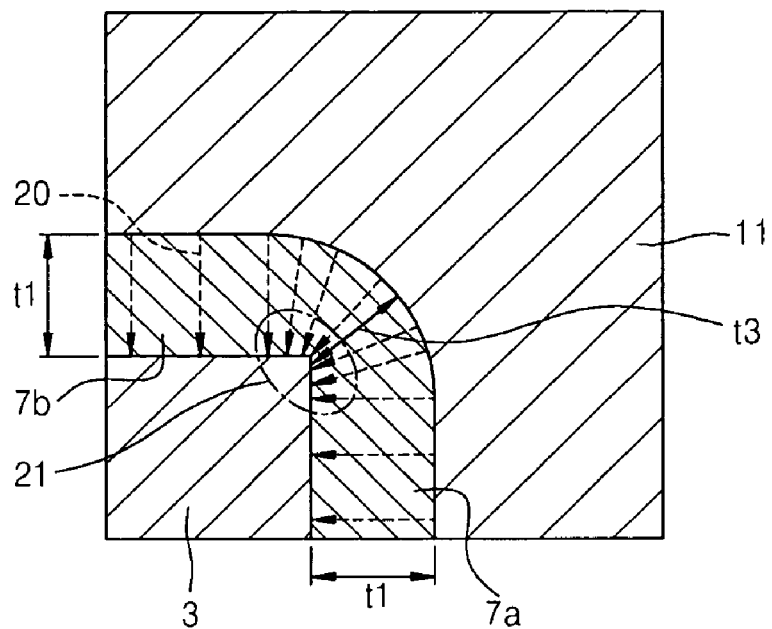
FIG. 11 is a cross-sectional view showing the case where an electric field concentrates around an upper edge of a fin of the fin field effect transistor of FIG. 9.
Figure 12:
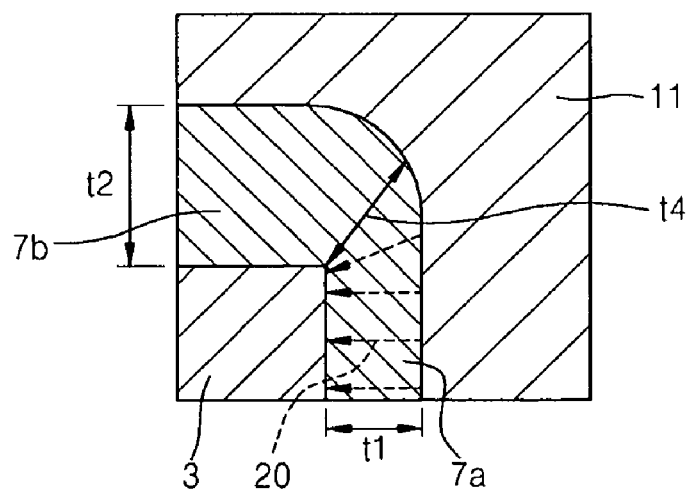
FIGS. 12 through 14 are cross-sectional views showing the case where an electric field concentration is prevented from occurring around an upper edge of a fin of the fin field effect transistor of FIG. 6.
Figure 13:
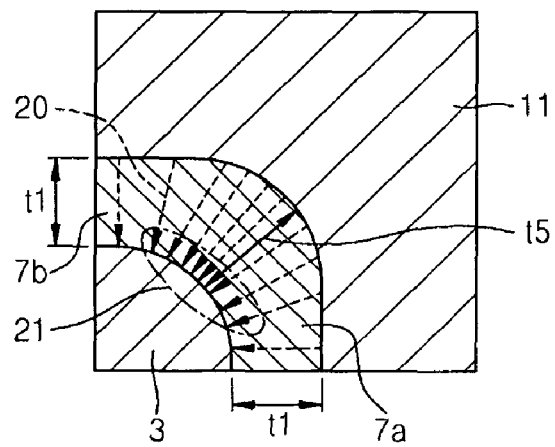
Figure 14:
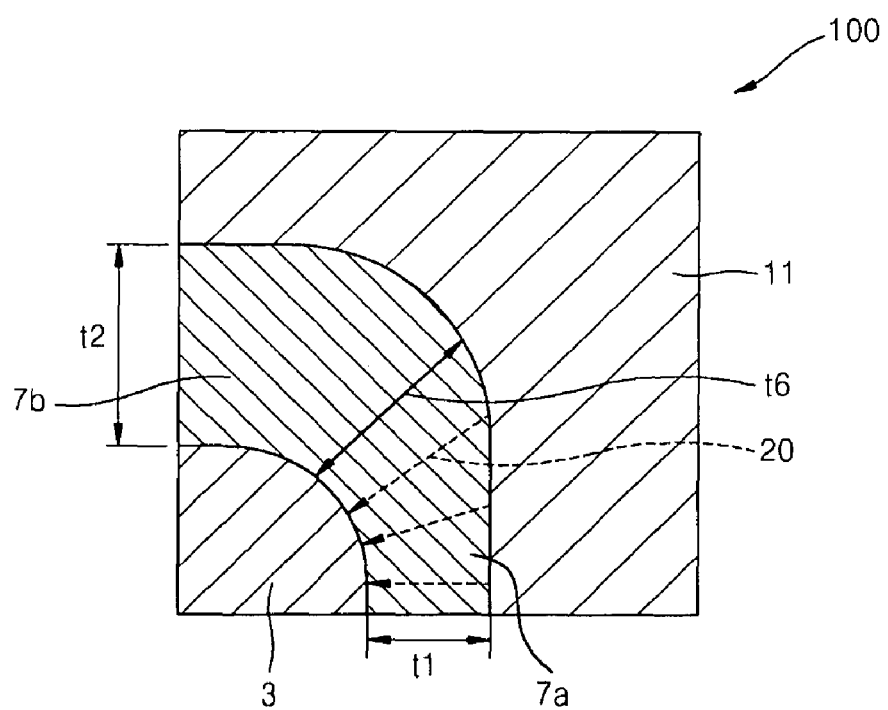

FIG. 11 is a cross-sectional view showing the case where an electric field concentrates around an upper edge of the fin 3 of the fin field effect transistor 200 of FIG. 9. FIGS. 12 through 14 are cross-sectional views showing the case where electric field concentration is prevented around an upper edge of the fin 3 of the fin field effect transistor 100 of FIG. 6, according to the inventive concept.

In the fin field effect transistor 200 of FIG. 1, the upper edge of the fin 3 is not rounded, and the thickness 't1' of the gate insulating layer 7a formed on an upper surface of the fin 3 is equal to the thickness 't1' of the gate insulating layer 7a formed on a lateral surface of the fin 3. In particular, the thickness 't3' of the gate insulating layer 7a or 7b formed on the upper edge of the fin 3 is smaller than the thickness 't1' of the gate insulating layer 7a or 7b formed on the upper or lateral surface of the fin 3. In this case, as indicated by a reference number '21', an electric field 20 concentrates around the upper edge of the fin 3.

In contrast, in the fin field effect transistor 100 of FIG. 12, the thickness 't2' of the gate insulating layer 7b formed on the upper surface of the fin 3 is greater than the thickness 't1' of the gate insulating layer 7a formed on the lateral surface of the fin 3. In particular, the thickness 't4' of the gate insulating layer 7a or 7b formed on the upper edge of the fin 3 is greater than the thickness 't1' of the gate insulating layer 7a formed on the lateral surface of the fin 3. In this case, as illustrated in FIG. 12, electric field concentration, which is indicated by arrows 20 in the upper edge of the fin 3, is reduced.

FIG. 13 illustrates the case where an upper edge of the fin 3 is rounded, according to an embodiment of the inventive concept. Referring to FIG. 13, as indicated by a reference number 21, electric field concentration, which is indicated by arrows 20, is reduced.

In particular, when the upper edge of the fin 3 is rounded as illustrated in FIG. 13, the thickness 't5' of the gate insulating layer 7a or 7b formed on the upper edge of the fin 3 is greater than the thickness 't1' of the gate insulating layer 7a or 7b formed on the upper or lateral surface of the fin 3. In this case, as illustrated in FIG. 13, electric field concentration, which is indicated by the arrows 20, is reduced.

FIG. 14 illustrates the combination of FIGS. 12 and 13, where electric field concentration, which is indicated by arrows 20, is reduced. That is, the thickness 't2' of the gate insulating layer 7b formed on the upper surface of the fin 3 is greater than the thickness 't1' of the gate insulating layer 7a formed on the lateral surface of the fin 3, and the upper edge of the fin 3 is rounded. In particular, as illustrated in FIG. 14, the thickness 't6' of the gate insulating layer 7a or 7b formed on the upper edge of the fin 3 is greater than the thickness 't1' of the gate insulating layer 7a formed on the lateral surface of the fin 3. The thickness 't6' of the gate insulating layer 7a or 7b is greater than the thickness 't3', and is greater than the thickness 't4' or 't5'. In this case, electric field concentration, which is indicated by the arrows 20, is largely reduced around the upper edge of the fin 3.

Hereinafter, various applications using a fin field effect transistor according to an embodiment of the inventive concept will be described. When the fin field effect transistor is used and packaged in an integrated circuit semiconductor device, for example, a DRAM device, a chip (a semiconductor chip) can be formed. The chip may be used in various applications. Several examples of the applications will be described.

Figure 15:
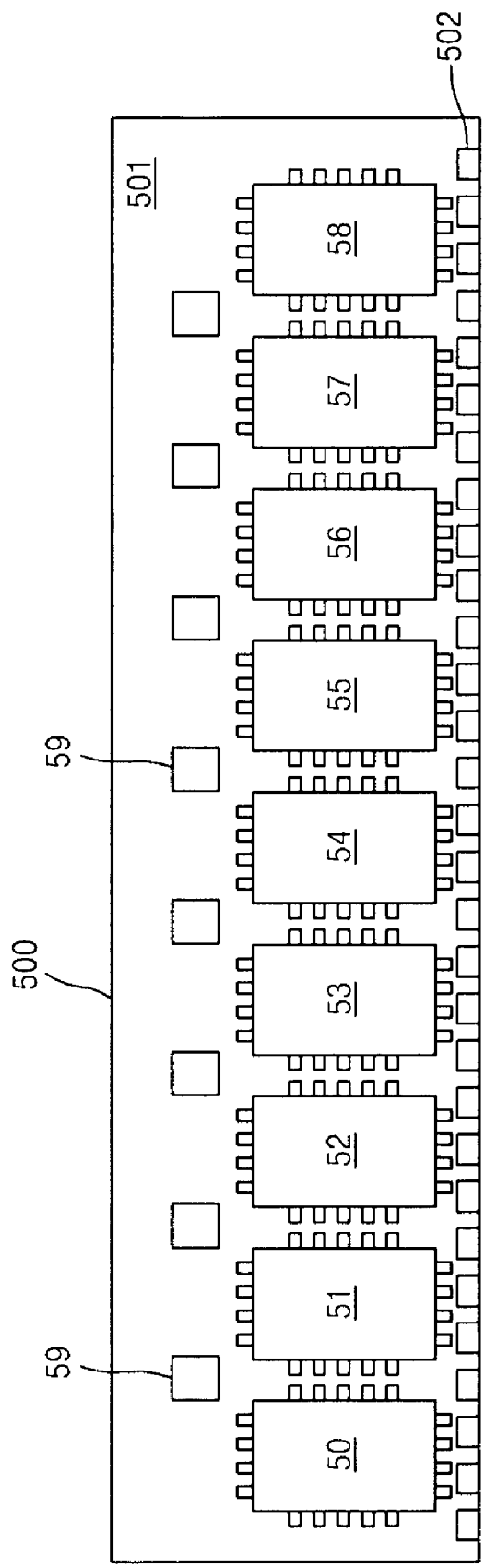
FIG. 15 is a plan view of a memory module including a chip, according to an embodiment of the inventive concept.

FIG. 15 is a plan view of a memory module including a chip, according to an embodiment of the inventive concept.

In particular, when a fin field effect transistor according to an embodiment of the inventive concept is used and packaged in an integrated circuit semiconductor device, chips 50 through 58 are formed. When the integrated circuit semiconductor device is a DRAM device, if the fin field effect transistor is packaged, DRAM chips are formed. The chips 50 through 58, for example, DRAM chips, may be used in a memory module 500. In the memory module 500, the chips 50 through 58 are attached to a module substrate 501. The memory module 500 includes a connection unit 502 that is disposed at a side of the module substrate and can be inserted into a mother board, and a ceramic decoupling capacitor 59 disposed on the module substrate 501. The inventive concept is not limited to the memory module 500 of FIG. 15. The memory module 500 can be manufactured in various configurations.

Figure 16:
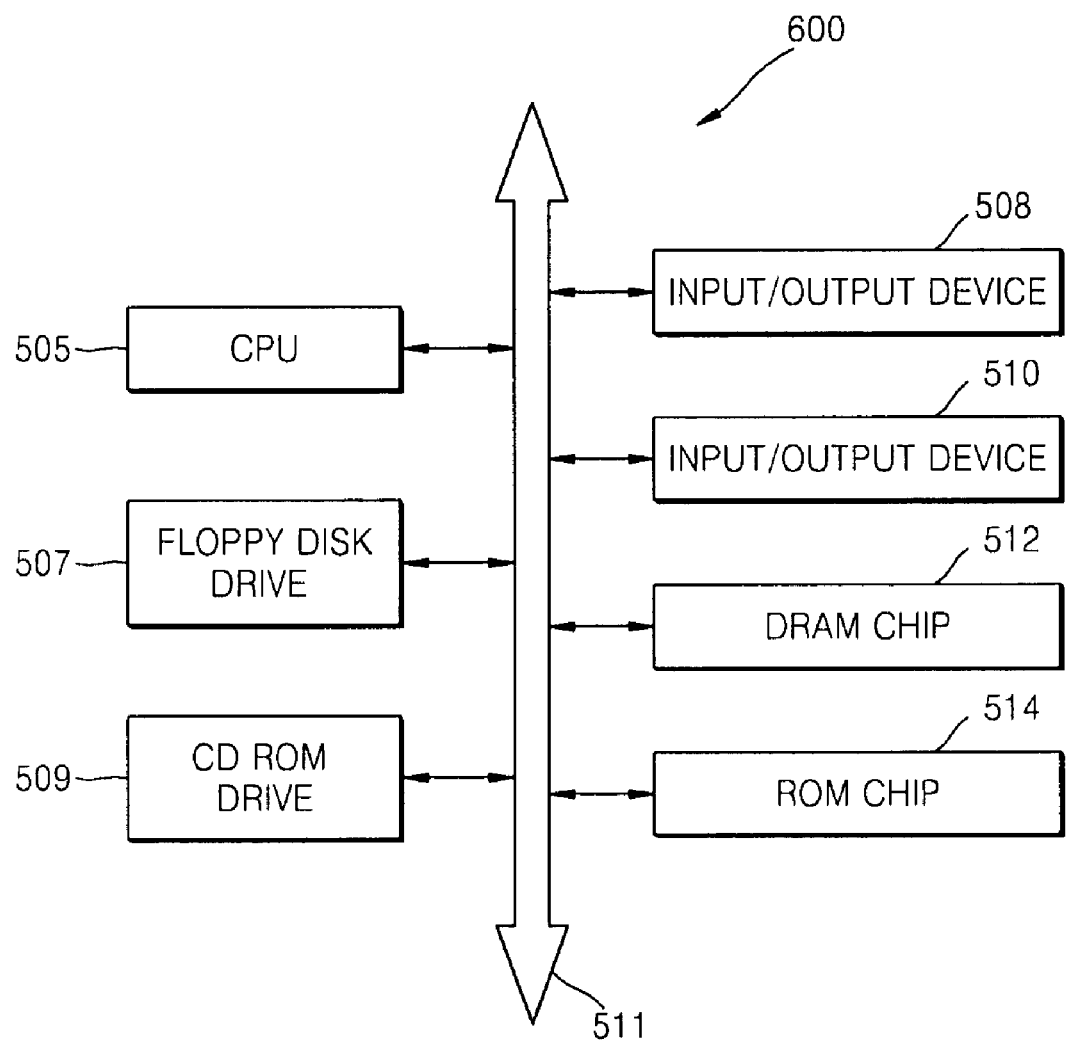
FIG. 16 is a block diagram of an electronic system including a chip, according to an embodiment of the inventive concept.

FIG. 16 is a block diagram of an electronic system 600 including a chip, according to an embodiment of the inventive concept.

Referring to FIG. 16, the electronic system 600 is a computer. The electronic system 600 includes a central processing unit (CPU) 505, a floppy disk drive 507, a peripheral device such as a CD read only memory (ROM) drive 509, an input/output device 508 and 510, a random access memory (RAM) chip 512, a read only memory (ROM) 514, etc. The above elements transmit and receive a control signal or data via a communication channel 511. In the electronic system 600 of FIG. 16, when an integrated circuit semiconductor device including a fin field effect transistor according to an embodiment of the inventive concept is packaged, the RAM chip 512 is embodied. The RAM chip 512 may be a DRAM chip. The RAM chip 512 of FIG. 16 may be replaced by the memory module 500 including the chips 50 through 58 illustrated in FIG. 15.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A method of fabricating a fin field effect transistor, the method comprising:

forming a fin protruding from a semiconductor substrate;

forming a gate insulating layer so as to cover upper and lateral surfaces of the fin while simultaneously rounding an upper edge of the fin, wherein a thickness of a portion of the gate insulating layer formed on the upper surface of the fin is greater than a thickness of a portion of the gate insulating layer formed on the lateral surface of the fin; and forming a gate electrode across the fin so as to cover the gate insulating layer.

2. The method of claim 1, wherein the forming of the gate insulating layer so as to cover the upper and lateral surfaces of the fin while rounding the upper edge of the fin is performed using an oxidation method including a plasma process.

3. The method of claim 2, wherein the oxidation method including the plasma process comprises forming the gate insulating layer on the fin while applying a bias voltage to the semiconductor substrate positioned on the semiconductor substrate positioned in a plasma chamber and rounding the upper edge of the fin by scattering and bombarding ions or radicals included in plasma.

4. A method of fabricating a fin field effect transistor, the method comprising:

forming a fin protruding from a semiconductor substrate; rounding an upper edge of the fin;

forming a gate insulating layer so as to cover the rounded upper edge of the fin and a lateral surface of the fin, wherein a thickness of a portion of the gate insulating layer formed on an upper surface of the fin is greater than a thickness of a portion of the gate insulating layer formed on the lateral surface of the fin, and forming a gate electrode across the fin so as to cover the gate insulating layer, wherein the rounding of the upper edge of the fin is performed by etching the upper edge of the fin using a dry etching process.

5. A method of fabricating a fin field effect transistor, the method comprising:

forming a fin protruding from a semiconductor substrate; rounding an upper edge of the fin;

forming a gate insulating layer so as to cover the rounded upper edge of the fin and a lateral surface of the fin, wherein a thickness of a portion of the gate insulating layer formed on an upper surface of the fin is greater than a thickness of a portion of the gate insulating layer formed on the lateral surface of the fin, and forming a gate electrode across the fin so as to cover the gate insulating layer, wherein forming of the gate insulating layer having a lateral portion and an upper portion thicker than the lateral portion is performed by increasing directional characteristics of oxidation gas injected to a plasma chamber while applying a bias voltage to the semiconductor substrate positioned in the plasma chamber.

6. A method of fabricating a fin field effect transistor, the method comprising:

forming a fin protruding from a semiconductor substrate; rounding an upper edge of the fin;

forming a gate insulating layer so as to cover the rounded upper edge of the fin and a lateral surface of the fin, wherein a thickness of a portion of the gate insulating layer formed on an upper surface of the fin is greater than a thickness of a portion of the gate insulating layer formed on the lateral surface of the fin, and forming a gate electrode across the fin so as to cover the gate insulating layer, wherein forming of the gate insulating layer having a lateral portion and an upper portion thicker than the lateral portion is performed by injecting oxygen ions having directional characteristics by applying an electric field to the semiconductor substrate positioned in the ion injection chamber and then oxidizing the fin, or by amorphizing the fin by injecting an ion to the semiconductor substrate positioned in the ion injection chamber, and then oxidizing the fin that is amorphized.

7. A method of fabricating a fin field effect transistor, the method comprising:

forming a fin protruding from a semiconductor substrate; rounding an upper edge of the fin;

forming a gate insulating layer so as to cover the rounded upper edge of the fin and a lateral surface of the fin, wherein a thickness of a portion of the gate insulating layer formed on an upper surface of the fin is greater than a thickness of a portion of the gate insulating layer formed on the lateral surface of the fin, and forming a gate electrode across the fin so as to cover the gate insulating layer, wherein the forming of the gate insulating layer having a lateral portion and an upper portion thicker than the lateral portion is performed by changing the plane index of the semiconductor substrate so that a reaction rate of the upper surface of the fin is faster than that reaction rate of the lateral surface of the fin.

* * * * *